US006198040B1

(12) United States Patent
Desousa et al.

(10) Patent No.: US 6,198,040 B1
(45) Date of Patent: Mar. 6, 2001

(54) GROUNDING COVER METHOD AND APPARATUS FOR ACCESSIBLE ELECTRONIC COMPONENT

(75) Inventors: Carl Desousa, San Jose; Robert Goyette, Santa Clara, both of CA (US)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 09/258,168

(22) Filed: Feb. 25, 1999

(51) Int. Cl.⁷ ...................................................... H05K 9/00
(52) U.S. Cl. ............................................ 174/35 R; 174/51
(58) Field of Search ............................ 174/35 R, 51, 174/67, 17 CT; 220/242, 3.8; 411/331

(56) References Cited

U.S. PATENT DOCUMENTS

| | | | |
|---|---|---|---|
| 3,140,344 | * | 7/1964 | Slater et al. ............................ 174/67 |
| 3,204,807 | * | 9/1965 | Ramsing ............................... 220/242 |
| 3,808,509 | * | 4/1974 | Frazier ............................... 220/242 X |
| 3,956,573 | * | 5/1976 | Myers et al. ........................ 174/67 X |
| 3,966,073 | * | 6/1976 | Geisel ................................. 174/67 X |
| 3,971,614 | * | 7/1976 | Paoli et al. .......................... 411/331 X |
| 4,036,396 | * | 7/1977 | Kennedy et al. ....................... 220/242 |
| 4,865,556 | | 9/1989 | Campbell et al. ....................... 439/97 |
| 5,317,105 | | 5/1994 | Weber .................................... 174/35 |
| 5,397,857 | | 3/1995 | Farquhar et al. .................... 174/52.1 |
| 5,677,511 | | 10/1997 | Taylor et al. ........................ 174/52.2 |
| 5,682,299 | | 10/1997 | Kunert ................................. 361/816 |
| 5,743,752 | * | 4/1998 | Massebeuf ........................ 220/242 X |
| 5,877,450 | * | 3/1999 | Quin ................................. 220/242 X |
| 5,955,702 | * | 9/1999 | Grossman et al. ................ 220/242 X |

* cited by examiner

Primary Examiner—Dean A. Reichard
(74) Attorney, Agent, or Firm—Sheridan Ross P.C.

(57) ABSTRACT

A Personal Computer Memory Card International Association (PCMCIA) or other access opening of an electronic device is provided with a conductive cover which may be hinged or otherwise coupled to allow the cover to be moved from a covering position to an uncovering position. A highly conductive pathway is provided from the covering to the chassis or faceplate of the electronic device such as using a conductive washer in a hinge coupling. The conductive pathway is useful in reducing or preventing electromagnetic interface (EMI) from the access opening and in dissipating electrostatic discharge (ESD) before, during and after moving the cover to the open position and/or manipulation of the components behind the access opening.

21 Claims, 3 Drawing Sheets

GROUNDING COVER METHOD AND APPARATUS FOR ACCESSIBLE ELECTRONIC COMPONENT

The present invention relates to a cover apparatus and method for covering some or all of one or more openings provided for accessing components of electronic equipment and in particular to a grounded cover such as for avoiding or reducing electromagnetic interference (EMI) and/or electrostatic discharge (ESD).

BACKGROUND INFORMATION

A number of electronic devices are configured with openings to permit ready access to some of the components of the device (e.g. without requiring opening the entire chassis of the electronic device). In many situations, ready access involves providing access through a wall or panel which is typically exposed, such as a front panel. For example, many computers, network devices (such as routers, switches, bridges and the like) and other equipment provide one or more PCMCIA openings or slots (i.e. openings configured to receive cards in accordance with the PC Card Standard promulgated by Personal Computer Memory Card International Association e.g. at http://www.pc-card.com/pccardstandard.htm) for receiving and removing components such as disk drives or other storage devices or media, modems, network connection cards and the like. While providing such openings is convenient when it is desired to insert or remove components or media, non-covered (or easily uncovered) openings can present a security risk (e.g. a risk of theft or other unauthorized removal, tampering and the like) particularly when the accessible components are relatively expensive. Furthermore, in some devices a function of the accessible component may be critical to operation of a larger system, such as a computer network, Internet, telephone or other communication system and the like. Thus, the ease of accessibility afforded by openings for components also presents the risk that unauthorized or unintentional removal or manipulation of a component may cause catastrophic losses of a larger system such as disabling an entire telephone or computer network. Accordingly, it would be useful to provide a system which preserves the convenience of access to components, especially front panel access (without opening an entire chassis), while avoiding unauthorized or inadvertent removal or manipulation of components.

Many electronic devices such as computers, network or telephone equipment and the like are designed in a fashion to avoid undesirably high levels of electromagnetic radiation, extending beyond the chassis of the device which can result in undesirable effects on adjacent electronic equipment including so-called electromagnetic interference (EMI). Indeed, several standards for maximum allowable levels of EMI have been established such as the Network Equipment Building Standards (available from Bellcore). Some designs for avoiding EMI involve using a substantially conductive, preferably grounded, chassis substantially surrounding the electronic equipment forming, substantially, a Faraday shell. Provision of openings in the chassis, such as openings as described above, create a risk of breaching the Faraday shell allowing an undesirable increase in potential EMI. One approach which has been used in this regard involves constructing a pocket (With suitable covers or connectors) for receiving the removable component or medium, made of a conductive material in electrical continuity with the chassis. This approach can be somewhat expensive and often requires utilization of substantial space within the chassis, which may be at a premium, particularly when the chassis itself must conform to certain standard sizes or form factors such a so-called rU form factors. Accordingly, it would be useful to provide a system for avoiding or reducing EMI from component-access openings with relatively low cost and space requirements.

Many electronic components, including those designed to be accessible without fully opening a chassis, and/or which are front-panel accessible, can be susceptible to voltage surges such as those that may be caused by electrostatic discharge (ESD) including components such as high density disk drives. In such susceptible components, ESD or other voltage surges can lead to malfunction and/or permanent damage to the component. Moreover, when the component is critical to functioning of a larger system such as a computer network or telephone system, ESD or other voltage surges can lead to catastrophic loss of function of an entire system. A number of standards setting acceptable levels of tolerable ESD have been promulgated, including, e.g., NIBS standards. Accordingly, it would be useful to provide a system which tends to ground or dissipate, in a relatively benign fashion, ESD or other voltage surges such as may otherwise occur when personnel touch or manipulate an accessible component in an electronic device.

SUMMARY OF THE INVENTION

The present invention, in at least one aspect, provides a substantially conductive cover for a PCMCIA slot or other opening which is grounded to the front panel or chassis. Preferably the cover can be moved from a covering position to an uncovering position while substantially maintaining a conductive path between the cover and the chassis or front panel. In one embodiment, the cover is hinged so that the cover remains physically (pivotally) coupled to the front panel even in the open position. In one case, conductive washers, bushings or similar components are provided in a system maintaining a conductive path to the faceplate during and after pivoting of a hinged cover. Preferably the cover is normally maintained in a closed position by a fastener configured such that opening the cover requires the use of a tool, e.g. to avoid inadvertent or casual opening. In one embodiment the cover is configured for automatic, preferably gravity-forced, closing of the cover. Preferably the fully closed cover is substantially sealed to the faceplate to form a substantially continuous conductive region, reducing or preventing EMI.

DETAILED DESCRIPTION

Figure 1:
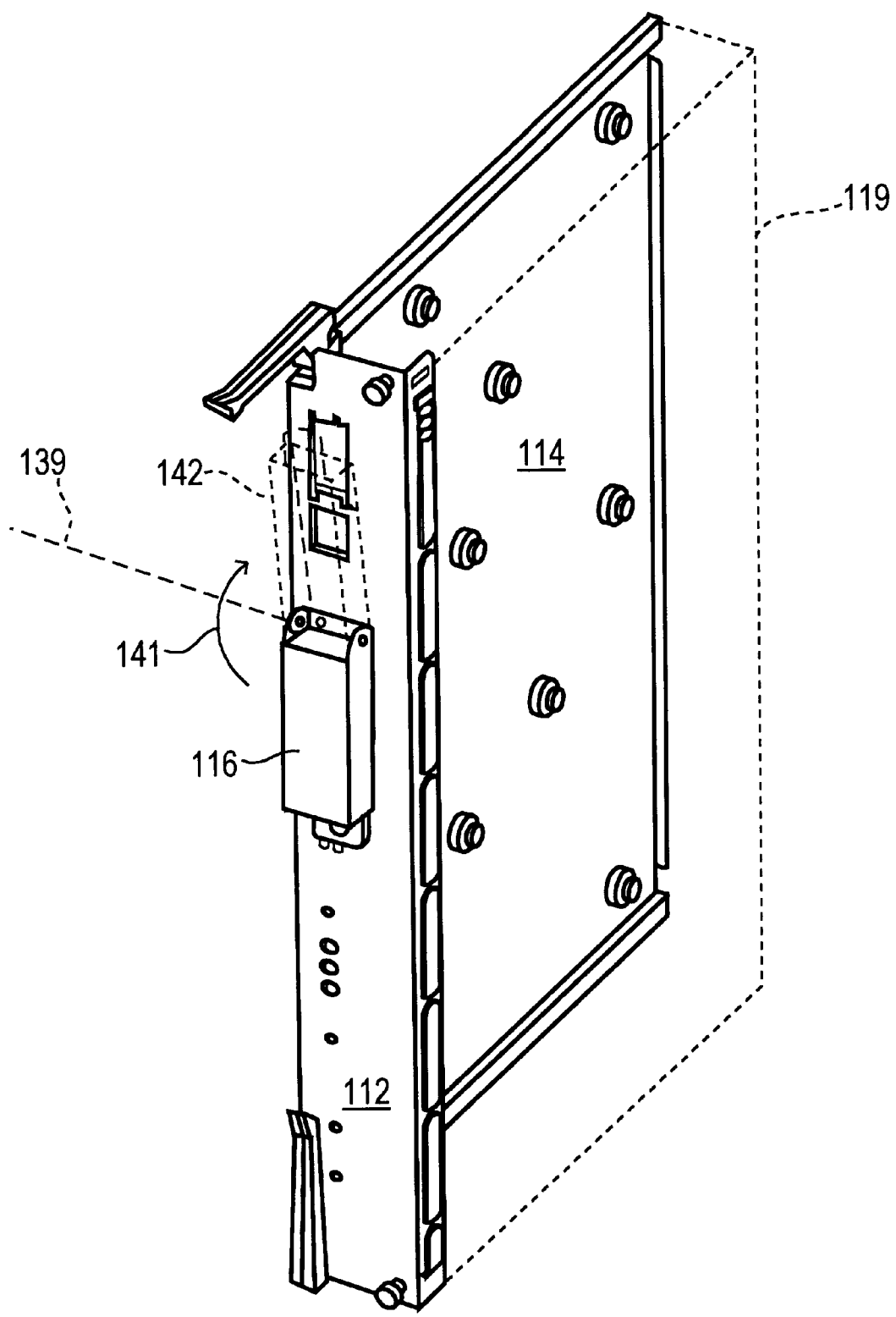
FIG. 1 is a perspective view of a faceplate and coupled card of an electronic device including a cover according to an embodiment of the present invention.
Figure 2:
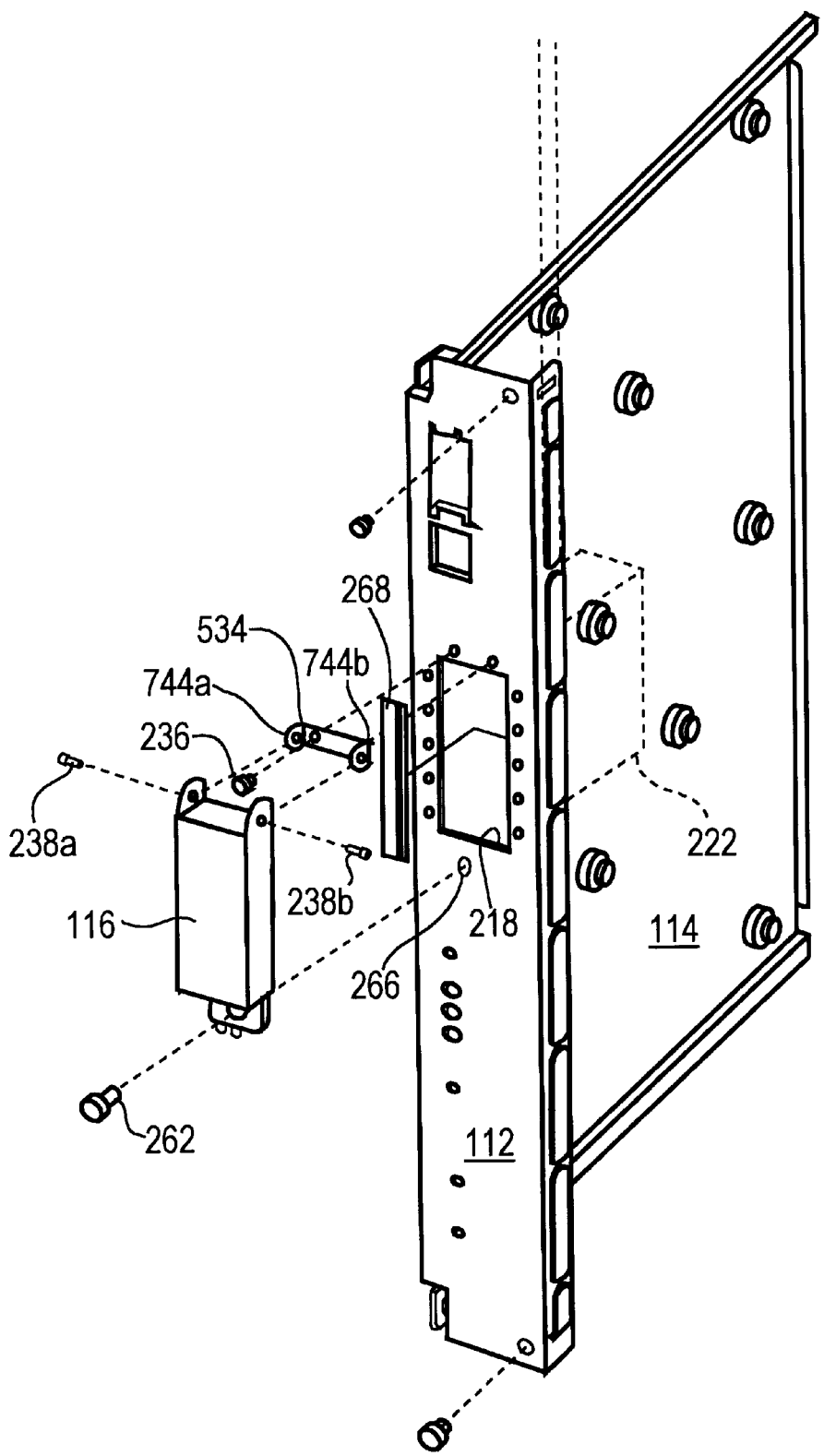
FIG. 2 is an exploded view of the device of FIG. 1.
Figure 5:
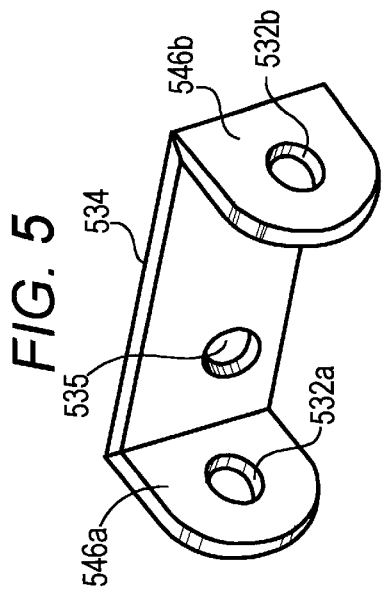
FIG. 5 is a perspective view of a hinge bracket usable for mounting the cover of FIGS. 3 and 4.
Figure 6:
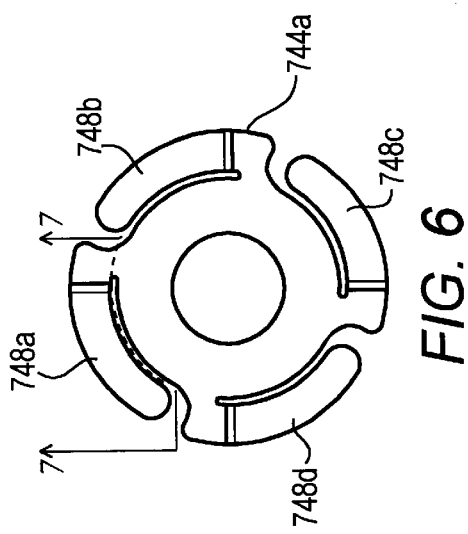
FIG. 6 is a plan view of a spring contact washer of a type which may be used in mounting the cover according to an embodiment of the present invention.
Figure 7:
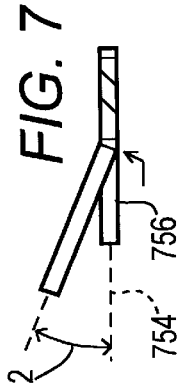
FIG. 7 is a cross-sectional view taken along lines 7—7 of FIG. 6.
Figure 4:
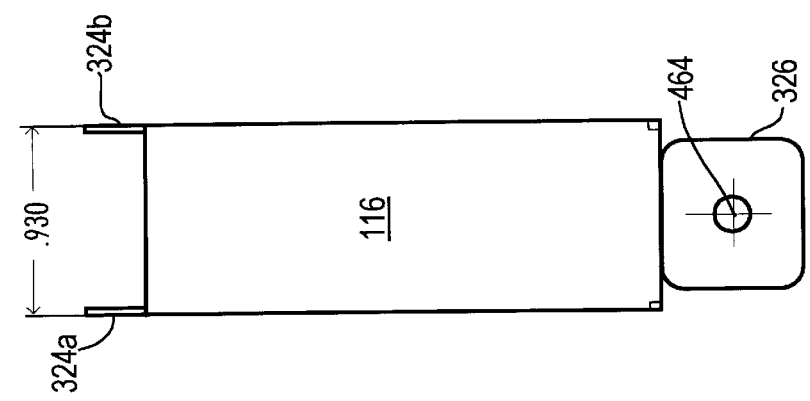
FIG. 4 is a front elevational view of the cover of FIG. 3.
Figure 3:
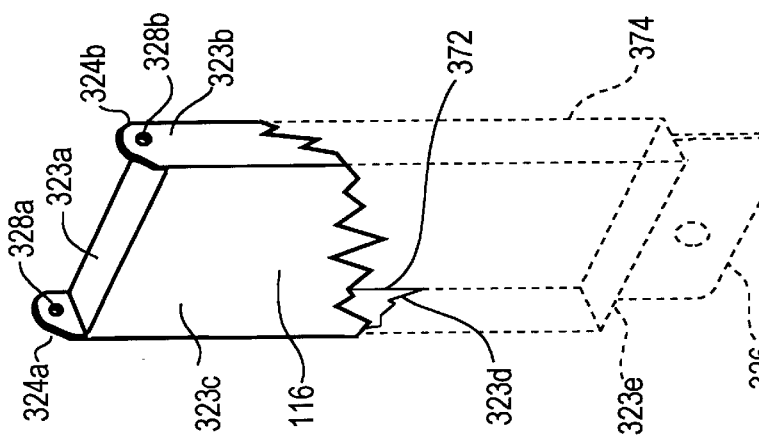
FIG. 3 is a perspective view of a cover according to an embodiment of the present invention.

FIG. 1 illustrates a front panel 112 and/or card carrier coupled to a circuit board 114 and having a cover 116 positioned over an opening 218 (FIG. 2) formed in the front panel 112. The opening 218 is sized and shaped to provide access to a component positioned at least partially in a space 222 aligned with the opening 218, behind the panel 112. The size and shape of the opening 218 and the space 222 (or the component located in the space) will depend on what type of component or components, and what type of access, are being provided. In one embodiment, the opening 218 is substantially the size of a PCMCIA slot and the space 222 is sufficiently large to accommodate a PCMCIA device. However, the present invention can be used in connection with a wide variety of sizes and shapes of openings 218 and spaces 222 and/or components, as will be clear to those of skill in the art after understanding the present invention.

The electronic device of which the circuit board 114 and cover plate 112 form a part, may be an electronic device which is intended for mounting in a rack. In the case of rack mounting, where a numerous electronic devices may be positioned in tight side-by-side locations, providing practical access to a component involves positioning an access opening 218 in the faceplate 112 which is exposed and accessible when the electronic device is mounted in a rack. In these cases, reduction of EMI may involve reducing or preventing radiation outwardly beyond the faceplate 112 and adequate grounding may involve providing a grounding path to the faceplate 112 which is typically, before, during and after cover rotation 141, substantially grounded to the rack or is independently coupled to a grounding pathway such as by a ground wire. In other situations, the electronic device may be housed in a box or chassis 119. In the case of a chassis-mounted electronic device, providing adequate access to a component may involve positioning one or more openings in any of the various chassis surfaces (including a faceplate or a rear surface). Providing adequate grounding may involve grounding either directly to the chassis 119, grounding directly to a grounding wire, or grounding to the faceplate 112 which is attached to, or forms a surface of, the chassis 119.

The cover 116 is preferably formed of a substantially conductive material such as zinc-plated beryllium copper alloy (BeCu). The depicted cover 116 is in the form of a hollow five-sided (323a,b,c,d,e) parallelepiped having first and second upstanding ears 324a,b with holes 328a,b alignable with holes 532a,b of a hinge bracket 534. The hinge bracket 534 may be coupled, e.g. via hole 535, to the (preferably conductive) faceplate 112, e.g. using a rivet 236, bolt, pin or similar device. Preferably the hinge bracket 534 is formed of a conductive material such as zinc-plated BeCu. Alignment of the cover ear holes 328a,b with the hinge bracket holes 532a,b allows the cover 116 to be pivotally coupled to the faceplate 112 e.g. using pins 238a,b, bolts, rivets, or similar devices. The pivotal coupling permits the cover 116 to be pivoted from the closed position shown in solid lines in FIG. 1 to a substantially open position 142 (fully or partially uncovering the opening 218) shown in phantom lines in FIG. 1.

Preferably, one or more washers 744a,b are positioned between, and substantially in contact with, the cover ears 324a,b and the hinge bracket arms 546a,b. Preferably the washers 744a,b are formed of a substantially conductive material such as (optionally zinc-coated) BeCu. As described below, the conductive washers, in contact with the cover ears 324a,b and bracket arms 546a,b are useful in providing a good conductive pathway between the cover 116 and the faceplate 112 and/or chassis. Preferably, the washers 744a,b are shaped to provide good physical and electrical contact to both the cover 116 and bracket 434, even during the process of rotating 141 the cover. In one embodiment, the washer 744 is configured with a plurality of legs 748a,b,c,d angled upwardly 752 with respect to the plane 754 of the main body 756 of the washer. Typically, the washer 744a,b will be somewhat compressed (against the urging of the resilient legs 748a,b,c,d) between the cover ears 324a,b and the bracket arms 546a,b. The configuration and position of the washer legs 748a,b c,d, whose resilient compression provides substantially constant contact of the washers with both the cover ears 324a,b and the bracket arms 546a,b during cover rotation 141, are believed to provide a good conductive pathway between the cover 116 and the faceplate 112 (or chassis 119) even during cover rotation 141. Other shapes of washers may be used and devices other than washers such as bushings, pins, bolts and the like may be used, in place of or in addition to washers, to provide a conductive pathway, as will be understood by those of skill in the art after understanding the present invention. The depicted invention is believed to be advantageous at least in terms of the aspects of requiring no welds, requiring relatively few parts, and in providing a configuration which is highly reliable and maintainable.

In the depicted embodiment, the cover 116 may be secured in the closed position e.g. by a captive screw 262 received through cover tab hole 464 and screwed into a threaded hole 266 on the cover plate 112 (or chassis 119). In one embodiment, the captive screw 262 is configured to discourage or substantially avoid loosening without the use of a separate tool. In this regard, the captive screw 262 may be provided with a substantially smooth, unknurled head. The head may be provided with, for example, a screwdriver slot, a hexagonal or security socket head and the like.

In one embodiment, the edge or perimeter (or portions thereof) of the opening 218 are engaged or covered with an EMI gasket or shield 268, preferably formed of a conductive material such as BeCu. Suitable gasket material available from TECH-ETCH, INC., Plymouth, Mass.

In use, the cover 116 is in the closed position during normal operation of the electronic device. Preferably, the captive screw 262 is sufficiently tightly coupled to the faceplate that the edges 372, 374 of the cover 116 are compressed against the EMI shield 268 positioned at the edges of the opening 218 so that an effectively continuous conductive region or area is provided over the opening 218, substantially preventing EMI in region beyond the faceplate 112 and cover 116.

A user wishing to access the component aligned with the opening 218 will typically employ a screwdriver, wrench or similar tool to loosen the captive screw 262. A configuration which requires the use of a tool for loosening the captive screw 262 effectively discourages or prevents a casual tamperer from opening the cover 116 and substantially avoids accidental opening of the cover 116. In one embodiment, the captive screw 262 is formed of a substantially conductive material or has a substantially conductive plating. Before, during or after loosening of the captive screw, the user will typically grasp or otherwise contact the cover 116. As described above, there is a substantive conductive pathway from the cover 116 to the faceplate 112 (and, typically, to a standard ground). In this way, even though the user may have accumulated a substantial static charge, such electrostatic charge will be dissipated to ground before the cover is opened. Any electrostatic or other voltage carried by the user will continue to be dissipated to ground as the user manually rotates 141, the cover to the open position 142. Because of the upper position of the rotation axis 134, gravity urges the opened cover 142 towards the closed position and accordingly, the user will typically continue to grasp the (still grounded) open cover 142. In this manner, the user continues to be grounded for any electrostatic charge while the user is removing, manipulating or otherwise contacting the (potentially ESD-sensitive) component through the opening 218. Following insertion, removal or manipulation of the electronic component, the cover will be released by the user (so that gravity will cause the cover to rotate back to a closed position) or the user will manually move the cover to the closed position. Preferably, the user will retighten the screw 262 to reconfigure the cover sealingly adjacent the EMI shield 268 as described above.

In light of the above description a number of advantages of the present invention can be seen. The present invention provides a degree of security by discouraging, avoiding or preventing accidental, casual or unauthorized opening of the cover and/or access to components located behind the cover. The present invention substantially reduces or prevents EMI with respect to an access opening. The present invention provides a grounding or discharge path for ESD which is preferably provided continuously during unfastening the cover, opening the cover and manipulation of the component through the opening. The present invention provides for substantially automatic (i.e. without the need for separate human intervention or action) closing of the cover. The present invention can achieve the described (and other) features while requiring relatively few parts, few (or, preferably no) welds, in a fashion which is reliable and maintainable. The system provides high quality grounding, shielding and immunization functions. The security, EMI, ESD and other issues raised by the presence of an access opening, preferably are addressed by embodiments of the present invention regardless of whether the electronic device is configured as a rack-mounted device (which may not be entirely enclosed on all sides by a conductive chassis), or a chassis-based device. The moveable coupling of the cover 116 to the faceplate 112 avoids misplacing or setting aside a cover member (as might occur, e.g. if the cover 116 was completely disconnected form the faceplate during uncovering of the opening 218). Furthermore, top-most position of the rotation axis 139 means that the action of gravity will tend to automatically close the cover 116 after the user has completed his insertion, removal or manipulation of the electronic component. Thus, even if the user neglects or forgets to take any actions after the insertion, removal or manipulation of the electronic component, the cover 116 will substantially automatically (under the urging of gravity) return to an (at least partially) closed configuration, providing at least partial EMI/ESD and/or security functions.

A number of variations and modifications of the invention and be used. It is possible to use some features of the invention without using others. For example, it is possible to provide a cover that achieves EMI and/or ESD protection or functions without providing automatic closing of the cover. Although it is believed preferable to provide a good conductive pathway via a hinge connection, there is no theoretical reason why similar conductive pathways cannot be provided using conductive wires or straps welded, riveted or bolted to the respective components. Although it is believed advantageous to provide a cover which substantially remains coupled (e.g. via hinge) to the faceplate even when the cover is open, at least some advantages of the present invention, such as EMI protection, can be achieved using covers which are coupled to the faceplate via a snap or similar coupling (e.g. permitting the cover to be entirely disconnected from the faceplate). Although a hollow parallelepiped-shaped cover has been depicted, other shapes can be provided including a solid parallelepiped, a plate and the like. Although a number of components described herein have been indicated as advantageously formed of a conductive material such as BeCu alloy, other (possibly less conductive) materials and/or platings may be used in various situations such as copper, aluminum, silver, gold, steel and the like. Although it is believed advantageous to use the force of gravity for providing automatic closing, other automatic closing devices can be used such as spring-loaded hinges, resilient living hinges and the like. Although a tab and screw arrangement has been described for maintaining the cover in a closed position, other arrangements can be used such as a latch or clasp.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for covering an access opening in a surface of an electronic device comprising:

a substantially conductive cover sized and shaped to at least partially cover said access opening;

a coupling for moveably connecting said cover with respect to said surface of said electronic device to permit said cover to be moved from a first position at least partially covering said access opening to a second position, different from said first position, at least partially uncovering said access opening;

a substantially conductive member in said coupling configured and positioned to provide a substantially conductive pathway between said cover and said surface when said cover is in said first position and when said cover is in said second position; and a substantially conductive seal adjacent at least a first edge of said access opening positioned to contact at least a first portion of said cover, providing a conductive pathway between said cover and said seal.

2. Apparatus as claimed in claim 1, wherein said coupling comprises a hinge.

3. Apparatus as claimed in claim 1, wherein said substantially conductive member comprises at least a first conductive washer.

4. Apparatus as claimed in claim 3, wherein said washer comprises a first body portion lying substantially in a first plane and at least a first leg member at a first angle to said first plane when said washer is in a relaxed configuration.

5. Apparatus as claimed in claim 4, wherein said first leg is resiliently deformable in a direction toward said first plane.

6. Apparatus as claimed in claim 1, wherein said cover has a substantially convex shape defining at least a first edge and wherein said at least a first portion of said cover includes at least a first length of said first edge.

7. Apparatus as claimed in claim 1 further comprising at least a first fastener for disengageably maintaining said cover in said first position, wherein disengagement of said fastener substantially requires use of a separate tool.

8. A method for covering an access opening in a surface of an electronic device comprising:

providing a substantially conductive cover sized and shaped to at least partially cover said access opening;

providing a coupling for moveably connecting said cover with respect to said surface of said electronic device to permit said cover to be moved from a first position at least partially covering said access opening to a second position, different from said first position, at least partially uncovering said access opening;

positioning a substantially conductive member in said coupling to provide a substantially conductive pathway between said cover and said surface when said cover is in said first position and when said cover is in said second position; and positioning a substantially conductive seal adjacent at least a first edge of said access opening, to contact at least a first portion of said cover, providing a conductive pathway between said cover and said seal.

9. A method as claimed in claim 8, wherein said step of providing a coupling comprises providing a hinge.

10. A method as claimed in claim 8, wherein said cover has a substantially convex shape defining at least a first edge and wherein said at least a first portion of said cover includes at least a first length of said first edge.

11. A method as claimed in claim 8, wherein said substantially conductive member comprises at least a first conductive washer.

12. A method as claimed in claim 11, wherein said washer comprises a first body portion lying substantially in a first plane and at least a first leg member at a first angle to said first plane when said washer is in a relaxed configuration.

13. A method as claimed in claim 12, further comprising compressing said washer between a portion of said cover and a portion of said coupling such that said first leg is resiliently deformed in a direction toward said first plane.

14. A method as claimed in claim 8 further comprising providing at least a first fastener for disengageably maintaining said cover in said first position, wherein disengagement of said fastener substantially requires use of a separate tool.

15. Apparatus for covering an access opening in a surface of an electronic device comprising:

a substantially conductive cover sized and shaped to at least partially cover said access opening;

coupling means for moveably connecting said cover with respect to said surface of said electronic device to permit said cover to be moved from a first position at least partially covering said access opening to a second position, different from said first position, at least partially uncovering said access opening;

substantially conductive means, in said coupling means, for providing a substantially conductive pathway between said cover and said surface when said cover is in said first position and when said cover is in said second position; and substantially conductive seal means adjacent at least a first edge of said access opening, for contacting at least a first portion of said cover, providing a conductive pathway between said cover and said seal.

16. Apparatus as claimed in claim 15, wherein said cover has a substantially convex shape defining at least a first edge and wherein said at least a first portion of said cover includes at least a first length of said first edge.

17. Apparatus as claimed in claim 15 further comprising at least first fastener means for disengageably maintaining said cover in said first position, wherein disengagement of said fastener means substantially requires use of a separate tool.

18. Apparatus as claimed in claim 15, wherein said coupling means comprises hinge means.

19. Apparatus as claimed in claim 15, wherein said conductive means comprises at least a first conductive washer.

20. Apparatus as claimed in claim 19, wherein said washer comprises a first body portion lying substantially in a first plane and at least first leg means at a first angle to said first plane when said washer is in a relaxed configuration.

21. Apparatus as claimed in claim 20, wherein said first leg means is resiliently deformable in a direction toward said first plane.

* * * * *